United States Patent [19]

Sparrowhawk et al.

[11] Patent Number: 4,830,922

[45] Date of Patent: May 16, 1989

[54] REMOVABLE CONTROLLED THICKNESS CONFORMAL COATING

[76] Inventors: Bryan L. Sparrowhawk, 2524 130th St. SE., Everett, Wash. 98204; John M. Redfield, Jr., 17048 3rd Ave. NE., Seattle, Wash. 98155

[21] Appl. No.: 834,777

[22] Filed: Feb. 28, 1986

[51] Int. Cl.$^4$ .......................... B05D 5/12; B32B 9/04
[52] U.S. Cl. .................................. 428/411.1; 427/96; 427/154; 427/155; 428/500; 428/901
[58] Field of Search ............... 427/96, 154, 155; 428/961, 411.1, 500; 106/14.22, 14.39, 14.44, 14.26; 252/26, 25

[56] References Cited

U.S. PATENT DOCUMENTS

| | | | |
|---|---|---|---|
| 3,661,615 | 5/1972 | Gray et al. | 427/96 |
| 3,933,674 | 1/1976 | Farnsworth | 252/171 |
| 3,935,339 | 1/1976 | Cooke, Jr. | 427/212 |
| 4,027,648 | 1/1977 | Bonnice | 125/11 R |
| 4,076,637 | 2/1978 | Hurst | 252/26 |
| 4,141,055 | 2/1979 | Berry et al. | 427/96 |
| 4,284,696 | 8/1981 | Ishida et al. | 430/42 |
| 4,331,153 | 5/1982 | Healy | 128/641 |
| 4,484,796 | 11/1984 | Sato et al. | 350/96.21 |
| 4,490,496 | 12/1984 | Maekawa et al. | 427/96 |
| 4,508,758 | 4/1985 | Wong | 427/96 |
| 4,516,581 | 5/1985 | Sessions | 128/639 |
| 4,518,631 | 5/1985 | Antonen | 427/96 |
| 4,525,422 | 6/1985 | Butt et al. | 427/96 |
| 4,561,991 | 12/1985 | Herbots et al. | 252/118 |
| 4,564,562 | 1/1986 | Wong | 427/96 |
| 4,587,140 | 5/1986 | Johnson et al. | 427/96 |
| 4,588,309 | 5/1986 | Uyehara et al. | 384/94 |
| 4,692,988 | 9/1987 | Shulver et al. | 29/458 |

OTHER PUBLICATIONS

Loctite Output (TM) brochure, LT-885.

*Primary Examiner*—Janyce Bell

[57] ABSTRACT

Easily removable conformable coatings having a controlled thickness with a predetermined minimum value are obtained by the application of a composition comprising a mixture of a viscous carrier material and small particles of a second material by any known method. When both the carrier material and the particulate material mixed therewith are selected to have high dielectric constants, the mixture may be used to obtain coatings suitable for protection of circuit boards supporting high impedance electrical circuits. A mixture of a commercially available grease, e.g., Amoco RYKON (TM), with glass microspheres comprising up to 50% of the volume and preferably in the size range 3-5 mils, provides excellent dielectric conformal coatings for high impedance circuit boards. By contrast, by selecting both the viscous carrier material and the particulate matter mixed therein to have high conductivity, electrically conductive coatings for particularized users may likewise be obtained according to this invention.

16 Claims, 1 Drawing Sheet

REMOVABLE CONTROLLED THICKNESS CONFORMAL COATING

TECHNICAL FIELD

This invention relates to compositions suitable for application as easily removable conformal coatings having a minimum controlled thickness, and especially to high resistance, removable, conformal coatings particularly suitable for application to high impedance microcircuit boards that encounter humidity, vibration, temperature changes and shock in use.

BACKGROUND ART

There are numerous situations, on both the military and civilian sectors, where assorted equipment includes high impedance electronic circuitry. Such circuits, either in their entirety or modular segments thereof often take the form of a dielectric fiberglass-epoxy resin circuit board provided with numerous apertures, often very close to each other, to receive interconnected circuit elements that operate at relatively high potential differences with respect to each other. Because of the high impedance of the circuit as a whole, there is usually only a very small heat generation during operation of the elements, and thus not enough thermal energy to evaporate any water that may condense on the board surface. Thus any condensation on the circuit board surface or on component portions adjacent thereto could cause electrical shorting between circuit elements. Furthermore, the touching by human hands of any portions of the board surface may leave thin deposits of body salts of organic material that, with ambient moisture, can provide electrical paths between adjacent electrical elements which should not be subjected to extraneous stray currents between each other. Any such residue or contamination, therefore, could be as harmful as actual condensation on the circuit board.

Therefore, it is common practice to apply conformal coatings to portions of such circuits, especially to the circuit board to which the elements are attached, to inhibit chemical corrosion, fungus growth, physical breakage from mechanical fatigue or shock, and more often to limit electrical conduction between conductive parts of the circuit under high relative humidity ambient conditions. Any organic salt residues or other ionizable contamination that locates on the circuit board becomes trapped under the conformal coating and is thereby sealed away from environment moisture and, therefore, will not ionize to provide a conductive path. Under certain circumstances, copper dendrites may tend to grow from and between individual components or the sockets into which they are plugged into the circuit board, and such spurious outgrowths can create serious problems. To avoid such problems, therefore, it is very important to be able to apply a thin conformal coating to elements that are to be protected from humidity and possibly chemical corrosion under circumstances involving vibration, temperature changes and shock.

Most known conformal coatings are viscous compositions that are readily applied to the desired surface with a trowel like device, e.g., a human finger, a wooden spatula or the tip of a small screw driver. The major problem in applying such a coating in this manner is that the applicant cannot ensure that the thickness of the coating does not fall below a certain critical minimum value.

Many commercially available conformal coatings for such purposes contain silicon compounds or resins that harden after application and are hard to remove. Therefore, when such a circuit board has to be worked on, e.g., by the removal or replacement of one or more elements mounted thereon, it would be advantageous if a known solvent applied to a conformal coating can be used to dissolve it away from the surface to which it adheres. Such a solvent may conveniently be contained in a pressurized can provided with a pressure actuated aerosol-type nozzle to which is attached a short small-bore tube to direct the solvent to the precise part at which the coating is to be dissolved. Well known examples of such packaging are automobile carburetor cleaning solvents. The ejection of a propellant gas with such a solvent assists in blowing away the dissolved coating and leaving a clean surface.

A need, therefore, clearly exists for a composition that is at least as convenient to use as known coating compositions, is easily removable preferably with commonly available solvents, and yet can readily be applied to have a minimum thickness not less than some predetermined value to ensure that there are no inadequately protected zones at which the surface impedance falls to such a low value that electrical problems can arise.

DISCLOSURE OF THE INVENTION

Accordingly, it is an object of this invention to provide a composition applicable to form a conformal coating of controllable thickness.

A further object of this invention is to provide a conformal coating of controlled thickness, which is both physically stable and chemically inert under anticipated conditions of storage or use.

Yet another object of this invention is to provide a removable conformal coating of controlled thickness.

An even further object of this invention is to provide a removable conformal dielectric coating of controlled thickness.

These and other related objects and benefits of this invention are realized by providing a first viscous material to serve as a carrier for a second material in particulate form, wherein the particles are selected to be within a predetermined size range related to the minimum desired thickness of the applied coating, wherein such carrier material and particulate material are thoroughly mixed when applied in use. In one embodiment of the composition of this invention, both the carrier material and the particulate material are selected to be strong dielectrics.

BRIEF DESCRIPTION OF DRAWINGS

The same numbers are used to identify the same or like elements in the various drawings and in the specification that follows.

BEST MODE FOR CARRYING OUT THE INVENTION

Figure 1:
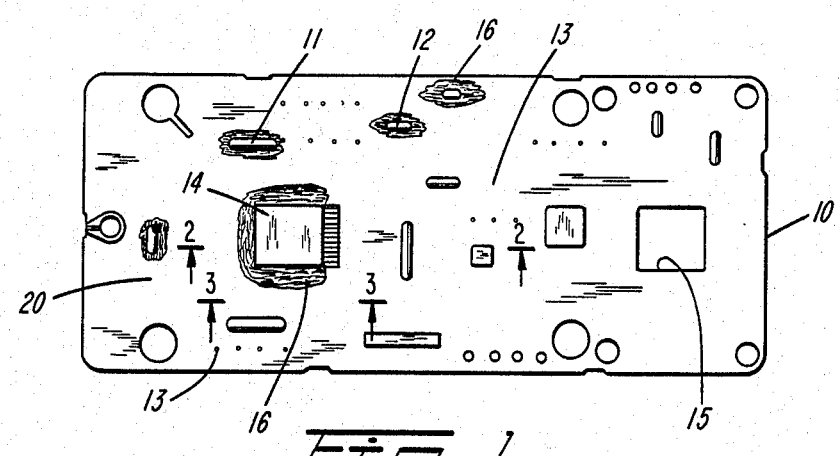
FIG. 1 is a plan view of a typical microcircuit board.
Figure 2:
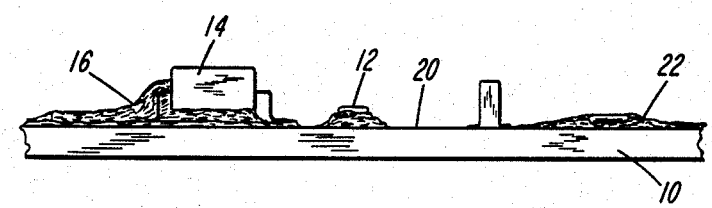
FIG. 2 is a side elevation view, at 2—2, of a portion of the microcircuit board of FIG. 1.

The typical circuit board has a generally flat dielectric element 10, often of generally rectangular shape, that is provided with an assortment of apertures shaped to accommodate a variety of electrical or electronic elements, typified by 11, 12 and 14, for location therein. Thus a typical element 14, e.g., an integrated circuit connector, as best seen in FIGS. 1 and 2, would be located in a comparably shaped aperture, e.g., 15. It is also common to have an array of small uniformly spaced apertures to accommodate the pins that extend from various elements. An electrically conductive pattern is printed or formed on the circuit board surface, preferably opposite to the surface at which circuit components are located. The components integrate into the conductive pattern to form the desired circuit. Thus the series of apertures 13 are suitable for accommodation of elements such as 11 and 12. As best seen in FIG. 2, when an element 12 has its end wires pushed into apertures provided therefore in board 12, the zone immediately surrounding the wires where they penetrate the board is often a point that is covered by a coating intended to prevent the access thereto of moisture, corrosive elements, or dust. The exposed portions of the leads of each component as well as the exposed edges of the component are similarly coated. Recent developments in compact circuit technology have led to an alternative to the pin-in-aperture component mounting technique, known popularly as "surface-mounting" of components. In either case, there is need for the type of coatings, having at least a predetermined minimum thickness, for easy conformal application and removal from the circuit board. Such a coating is indicated in FIG. 2 by the somewhat nonuniform line 22 slightly above the top surface 20 of circuit board 10.

In certain circumstances, where the edges at which an electrical element such as 14 meet top surface 20 of circuit board 10, as best seen in FIG. 2, it is customary to take a composition with suitable characteristics and to apply it by hand or with a spatula like element, with results as indicated by 16 in the plan view of the board as best seen in FIG. 1. Note that in FIG. 1 the right-hand side of element 14 is shown uncoated to indicate the sometimes crowded disposition of leads that must be adequately coated by the conformal coating to be applied thereon.

Unless great care is exercised, and sometimes even then because of the awkward geometry and limited spaces available, some portions of the exposed leads and the top surface of circuit board 10 adjacent these leads may have too thin a layer of the coating or none at all, as indicated at the uncoated top surface 20 on FIG. 2. Obviously, with sensitive equipment or highly demanding operational circumstances, it is very important to avoid such interruptions of the conformal coating.

Figure 3:
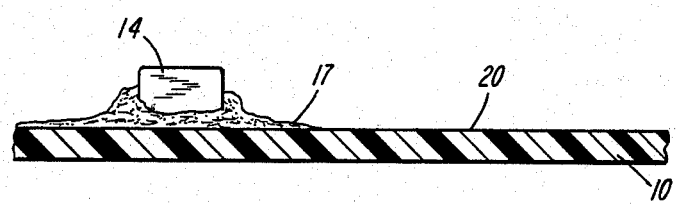
FIG. 3 is a vertical cross-sectional view, at 3—3, of a portion of the microcircuit board of FIG. 1.
Figure 5:
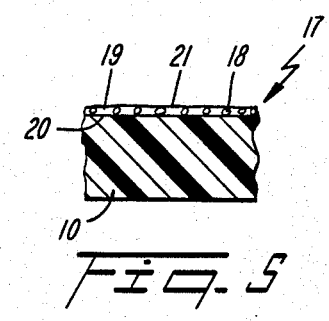
FIG. 5 is an enlarged vertical cross-sectional view of a portion of the microcircuit board of FIG. 1, showing a conformal coating of controlled thickness according to this invention.

In the process of developing such coatings, it was discovered that if small particles of a relatively firm substance were mixed in with a viscous carrier material having otherwise suitable characteristics, the mixture could be spread to a desired thickness having at least a predetermined minimum value determined by the size range of the particles in the mixture. Thus as indicated in FIG. 3 around a typical electrical element 14 supported by circuit board 10 an initial layer 17 of the mixture according to this invention may be applied to the circuit board 10 where desired. Until the layer is smeared out sufficiently, there may be some portions as indicated by 20 where the top surface of circuit board 10 is not coated. Then, if the composition 17 is smeared or distributed further, either by the user's finger, a flat spatula-like tool or the like, the layer of the mixture should appear as indicated in FIG. 5, wherein the circuit board 10 has on its top surface 20 a layer 17 containing small particles 18 interspersed among a viscous carrier material 19 and having a top surface 21, such that the layer 17 has a thickness determined by the size of particles 18.

As will be immediately obvious to persons skilled in the art, in order to obtain a relatively uniform distribution of particles 18 on the top surface of board 10 it is necessary that the particles 18 and the carrier material 19 be thoroughly mixed with each other. It will also be obvious to such persons that there must be a sufficient amount of the particulate matter to ensure that there are no patches where the density of particulate matter is so low that the general thickness of the coating thereabouts falls below the desired minimum value.

Experiments to obtain a composition suitable for use with electric circuit boards, having good dielectric properties for high impedance circuit mounted thereon, indicate that a stable viscous grease, e.g., Amoco RYKON EP-2 grease, when mixed with glass microspheres or microballoons, of the type used as filler with epoxy resins for marine and aeronautical applications, provides a suitable mixture for such coatings. Experiments with different proportions of such microspheres with the RYKON grease suggest that up to 50% of the mixture volume may be constituted of the microspheres to obtain satisfactory coatings. It was also found, in the course of these experiments, that many conventionally available and pressure-packaged organic solvents may be sprayed onto such a coating in order to dissolve the grease and, under the pressure of the released pressurized gas to propel the solvent, blow away the dissolved grease and the microspheres that were mixed therewith.

Figure 4:
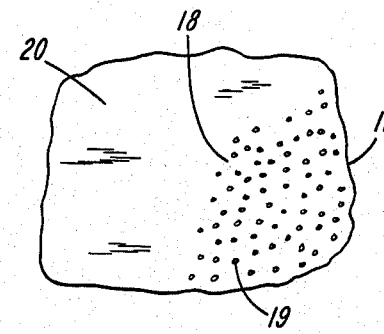
FIG. 4 is an enlarged plan view of a portion of the surface of the circuit board of FIG. 1, showing both the conformal coating of this invention and an uncoated area.

FIG. 4 is intended to indicate a portion of the coating of mixture 17 containing particles 18 in plan view, with an adjacent portion from which the coating has been dissolved and blown away. Thus the clear portion 20 towards the left in FIG. 4 indicates that the coating 17 has been dissolved and removed whereas the coated portion towards the right shows a relatively high density of particulate matter 19 in the coating 17.

As will be immediately apparent to persons skilled in the art, by judicious selection of the carrier material and the particulate matter a user can generate compositions that will serve a variety of purposes. It is quite common for printed circuit boards to be used in industrial locations where there may be temperature changes, and the equipment may be subjected to shock or vibration. Obviously, under such circumstances the user would want to select a viscous carrier material that will not become unstable, less viscous, or chemically reactive with any of the materials that it encounters in use. Likewise the material used for the particulate matter must be similarly physically stable and chemically inert. Also, the shape of individual particles may be selected as desired, e.g., to be generally spherical or, with crystalline materials, generally cubical in shape.

For uses where the weight of the equipment is very important, e.g., for space travel applications, it may be desirable to use hollow glass spheres as the particles. For other applications, there is nothing to prevent a user from mixing what would otherwise be regarded as electrically conductive material, e.g., a metal in finely powdered form, mixed in with a dielectric grease for use even in circumstances where a relatively high dielectric quality is desired of the coating. The reason for this, as will be apparent to persons skilled in the art, is that every single small particle in the mixture is intimately coated with the grease which has a relatively high dielectric constant and, therefore, each particle is electrically isolated from every other particle and does not, except under very unusual circumstances, communicate electrical charge to other particles at a distance.

In principle, therefore, depending on the desired minimum thickness, there is a wide variety of materials that are suitable for the particulate portion of the mixture. Most thick hydrocarbon type greases have sufficient stickiness and a high enough viscosity to serve as a satisfactory carrier material that can be readily removed by a variety of known organic solvents. Such organic solvents packaged in small canisters with pressure actuated aerosol-type release valves, with small bore tubular extensions to guide the solvent spray to a precise location, are commercially available and can be used effectively to remove such a coating as is taught by the various embodiments of this invention.

Considerations of cost, the particular circumstances of use, the manner in which the coating is to be applied, and the like, must be taken into account in selecting both the carrier material and the particulate material as well as in determining the ratio of the two in the mixture. It is believed that having excessive amounts of particulate matter does not improve the general qualities desired of such coatings.

Experiments indicate that for many applications, not involving extreme conditions of temperature, etc., up to 50% by volume of the mixture may be allowed to the particulate material for satisfactory coatings to be obtained thereby. Such experiments also indicate that having particulates in the size range 3-5 mils provides for excellent conformal coatings on circuit boards.

Numerous variations, relating to particle sizes, shapes and volumetric ratios with respect to the carrier material, tailored to particular circumstances, will no doubt occur to persons skilled in the art. For example, if coatings of different thickness are required on different part of a circuit board, it should be relatively simple to make the particulate matter of different colors for different size ranges and it may even be advantageous to make some or all of the particles fluorescent.

In sharp contrast to dielectric coating compositions, circumstances may require that the coating be electrically conductive. Numerous electrically conductive viscous materials are known, particularly in the medical field where such materials are used to provide good contact between the skin of a patient and electrocardiograph terminals. A mixture of such an electrically conductive viscous carrier material with electrically conductive particulate matter, e.g., micronized aluminum powder, may be used effectively to obtain electrically conductive coatings having a predetermined minimum thickness. Various other such variations on this invention will be apparent to persons skilled in the art seeking to practice the invention.

It should be apparent from the preceding that this invention may be practiced otherwise than as specifically described and disclosed herein. Modifications may therefore be made to the specific embodiments disclosed above, without departing from the scope of this invention, and such are intended to be included within the claims appended below.

What is claimed is:

1. An electrical circuit board having a portion of its surface conformally coated with an easily removable coating of a desired thickness, comprising
   a dielectric board for mounting of an electrical circuit thereon,
   a predetermined pattern of electrically conductive material mounted on a first side of said board to serve as a portion of said electrical circuit,
   at least one electrical component supported by said board and in electrical contact with said conductive pattern to form said electrical circuit mounted on said board, and
   an easily removable, physically-stable, chemically-inert coating of a desired thickness formed of a composition comprising a through mixture of a viscous, adhesive, easily removable, physically-stable, chemically-inert carrier selected from the group consisting of dielectric hydrocarbon greases and a physically-stable, chemically-inert particulate material, wherein said carrier has a consistency effective to contain said material and to maintain the shape of said coating and said material has a particle size equal to a minimum desired coating thickness and is mixed in a volumetric proportion to said carrier effective to provide at least one layer of material covering at least a portion of said surface and to determine said coating thickness, said coating conformally coating a portion of said board to at least said minimum thickness.
2. The circuit board of claim 1, wherein said particulate material is a dielectric material.
3. The circuit board of claim 1, wherein said particulate material is an electrically conductive material.
4. The circuit board of claim 3, wherein the electrically conducted particulate material is aluminum powder.
5. The circuit board of claim 1, wherein said carrier is soluble in a solvent so that upon application of said solvent under normal ambient conditions to said coating, said solvent renders said carrier and said particulate material easily removable.
6. The circuit board of claim 2, wherein said material comprises a glass material.
7. The circuit board of claim 6, wherein said glass material is microspheres.
8. The circuit board of claim 7, wherein said microspheres are hollow.
9. The circuit board of claim 1, wherein said mixture has the ability to securely adhere to an inclined surface even when said inclined surface is subjected to acceleration, shock or prolonged vibration.
10. The circuit board of claim 1, wherein said particulate matter comprises not more than half of the volume of said coating.
11. The circuit board of claim 1, wherein the particle size of said material is about 3-5 mils.
12. The circuit board of claim 1, wherein said particles are of a generally spherical shape.
13. The circuit board of claim 1, wherein said particles of a generally cubical shape.
14. The circuit board of claim 1, wherein said particles are selected to be of a color indicative of said size.

15. The circuit board of claim 1, wherein said particles comprise a fluorescent material.

16. A method of coating an electrical circuit board with an, easily removable, conformal dielectric coating of a desired thickness, comprising thoroughly mixing a viscous, adhesive, easily removable, physically-stable, chemically-inert dielectric hydrocarbon grease carrier and a physically-stable, chemically-inert, dielectric particulate material, said carrier having a consistency effective to maintain its shape and to contain said material and said material having a particle size equal to a minimum desired coating thickness and being mixed in a volumetric proportion to said carrier effective to provide a consistent mixture comprising at least one layer of the material covering at least a portion of an electrical circuit board onto which it is coated and to determine said coating thickness, applying said consistent mixture onto the portion of said board to be covered to form a an, easily removable, physically-stable, chemically-inert, dielectric coating of a desired thickness which conforms to the surface of the covered portion of said board.

* * * * *